(12) United States Patent
Tsutsumi et al.

(10) Patent No.: US 11,075,614 B2
(45) Date of Patent: Jul. 27, 2021

(54) PIEZOELECTRIC THIN FILM RESONATOR, FILTER, AND MULTIPLEXER

(71) Applicant: TAIYO YUDEN CO., LTD., Tokyo (JP)

(72) Inventors: Jun Tsutsumi, Tokyo (JP); Takeshi Sakashita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 411 days.

(21) Appl. No.: 15/796,503

(22) Filed: Oct. 27, 2017

(65) Prior Publication Data

US 2018/0145655 A1    May 24, 2018

(30) Foreign Application Priority Data

Nov. 24, 2016  (JP) .............................. JP2016-228266

(51) Int. Cl.
*H03H 9/17*    (2006.01)
*H03H 9/02*    (2006.01)
*H03H 9/05*    (2006.01)
*H03H 3/02*    (2006.01)
*H03H 9/56*    (2006.01)
*H03H 9/70*    (2006.01)

(52) U.S. Cl.
CPC ............. *H03H 9/175* (2013.01); *H03H 3/02* (2013.01); *H03H 9/02015* (2013.01); *H03H 9/02118* (2013.01); *H03H 9/0523* (2013.01); *H03H 9/0571* (2013.01); *H03H 9/173* (2013.01); *H03H 9/568* (2013.01); *H03H 9/706* (2013.01); *H03H 2003/021* (2013.01)

(58) Field of Classification Search
CPC ...... H03H 9/175; H03H 3/02; H03H 9/02015; H03H 9/0571; H03H 9/173
See application file for complete search history.

(56) References Cited

U.S. PATENT DOCUMENTS

| 5,100,579 A | 3/1992 | Higuchi et al. | |
| 2004/0125970 A1* | 7/2004 | Kawakubo | ............... H03H 3/02 381/190 |
| 2004/0246075 A1* | 12/2004 | Bradley | ................... H03H 3/04 333/187 |

(Continued)

FOREIGN PATENT DOCUMENTS

| JP | 9-130199 A | 5/1997 |
| JP | H9-289209 A | 11/1997 |

(Continued)

OTHER PUBLICATIONS

Oxide Ceramics Aluminum Al2O3 Density Characteristics (Year: 2020).*

(Continued)

*Primary Examiner* — Bryan P Gordon
(74) *Attorney, Agent, or Firm* — Chen Yoshimura LLP

(57) ABSTRACT

A piezoelectric thin film resonator includes: a substrate; a piezoelectric film located on the substrate and including a penetration hole penetrating therethrough; a lower electrode and an upper electrode facing each other across at least a part of the piezoelectric film; and a protective film covering an upper surface of the piezoelectric film, a side surface of the piezoelectric film, and an inner surface of the penetration hole.

18 Claims, 17 Drawing Sheets

(56) References Cited

U.S. PATENT DOCUMENTS

| | | | |
|---|---|---|---|
| 2006/0033595 A1 | 2/2006 | Nagao et al. | |
| 2010/0253658 A1* | 10/2010 | Tanaka | G02F 1/13454 345/205 |
| 2013/0256798 A1* | 10/2013 | Kinoshita | H01L 27/1214 257/347 |
| 2014/0055790 A1* | 2/2014 | Inao | H01S 5/06 356/479 |
| 2014/0175949 A1* | 6/2014 | Kando | H01L 41/313 310/363 |
| 2014/0354110 A1* | 12/2014 | Araki | H03H 3/02 310/311 |
| 2015/0145381 A1* | 5/2015 | Kyoung | H03H 9/19 310/365 |
| 2015/0280687 A1* | 10/2015 | Burak | H03H 9/175 310/321 |

FOREIGN PATENT DOCUMENTS

| | | |
|---|---|---|
| JP | 2005-6304 A | 1/2005 |
| JP | 2005-173106 A | 6/2005 |
| JP | 2006-210474 A | 8/2006 |
| JP | 2010-154233 A | 7/2010 |
| JP | 2012-004063 A | 1/2012 |
| JP | 2013-211410 A | 10/2013 |
| WO | 2005/060091 A1 | 6/2005 |
| WO | 2009/072336 A1 | 6/2009 |
| WO | 2013/031725 A1 | 3/2013 |
| WO | 2013/125371 A1 | 8/2013 |

OTHER PUBLICATIONS

Japanese Office Action dated Jan. 8, 2019, in a counterpart Japanese patent application No. 2016-228266. (A machine translation (not reviewed for accuracy) attached.).

Japanese Office Action dated Jun. 18, 2019, in a counterpart Japanese patent application No. 2016-228266. (A machine translation (not reviewed for accuracy) attached.).

\* cited by examiner

PIEZOELECTRIC THIN FILM RESONATOR, FILTER, AND MULTIPLEXER

CROSS-REFERENCE TO RELATED APPLICATION

This application is based upon and claims the benefit of priority of the prior Japanese Patent Application No. 2016-228266, filed on Nov. 24, 2016, the entire contents of which are incorporated herein by reference.

FIELD

A certain aspect of the present invention relates to a piezoelectric thin film resonator, a filter, and a multiplexer.

BACKGROUND

Acoustic wave devices using piezoelectric thin film resonators have been used as filters and multiplexers of wireless devices such as, for example, mobile phones. The piezoelectric thin film resonator has a structure designed to have a lower electrode and an upper electrode facing each other across a piezoelectric film. It has been known to form the lower electrode, the piezoelectric film, and the upper electrode on a support and then form a protective film protecting the upper electrode and the piezoelectric film from the above across the entire surface as disclosed in, for example, Japanese Patent Application Publication No. 9-130199.

The piezoelectric thin film resonator has a poor moisture resistance, and thus the piezoelectric thin film resonator is used after being hermetically sealed. A hermetic sealing package is large and expensive. Thus, it is considered to cover the piezoelectric thin film resonator with a protective film to improve the moisture resistance of the piezoelectric thin film resonator. However, since the piezoelectric thin film resonator has a complicated shape, the improvement of the moisture resistance is not easy.

SUMMARY OF THE INVENTION

According to a first aspect of the present invention, there is provided a piezoelectric thin film resonator including: a substrate; a piezoelectric film located on the substrate and including a penetration hole penetrating therethrough; a lower electrode and an upper electrode facing each other across at least a part of the piezoelectric film; and a protective film covering an upper surface of the piezoelectric film, a side surface of the piezoelectric film, and an inner surface of the penetration hole.

According to a second aspect of the present invention, there is provided a filter including: the above piezoelectric thin film resonator.

According to a third aspect of the present invention, there is provided a multiplexer including: the above filter.

DETAILED DESCRIPTION

Hereinafter, embodiments of the present invention will be described.

First Embodiment

For example, aluminum nitride used as a piezoelectric film is deliquescent. Thus, the piezoelectric thin film resonator is hermetically sealed so that water does not adsorb to the piezoelectric film. The hermetic sealing package is large and expensive. Thus, the use of a small and inexpensive package that improves the moisture resistance of the piezoelectric thin film resonator enables the size reduction and cost reduction. However, since the piezoelectric thin film resonator has a complicated structure, the moisture resistance is not sufficiently secured only by covering the upper surface and the side surface of the piezoelectric film with a protective film. The inventors focused on the side surface of a penetration hole penetrating through the piezoelectric film.

Figure 1A:
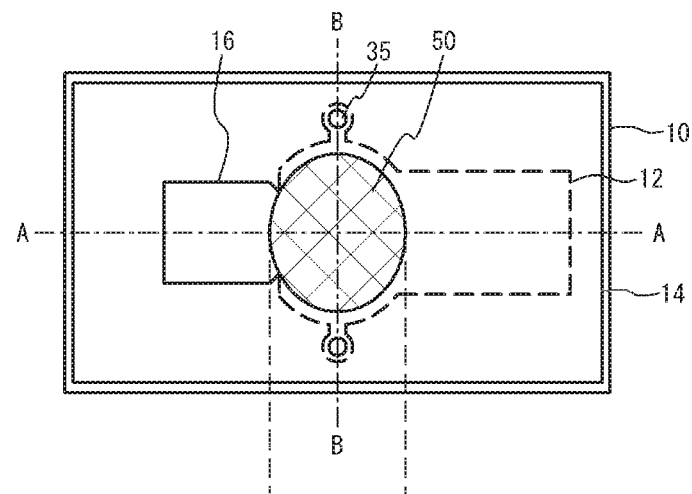
FIG. 1A is a plan view of a piezoelectric thin film resonator in accordance with a first embodiment.
Figure 1B:
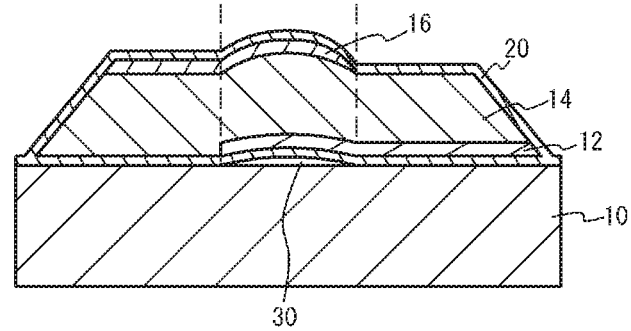
FIG. 1B is a cross-sectional view taken along line A-A in FIG. 1A.
Figure 1C:
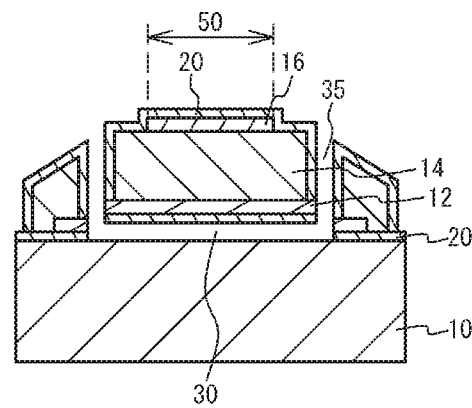
FIG. 1C is a cross-sectional view taken along line B-B in FIG. 1A.

FIG. 1A is a plan view of a piezoelectric thin film resonator in accordance with a first embodiment, FIG. 1B is a cross-sectional view taken along line A-A in FIG. 1A, and FIG. 1C is a cross-sectional view taken along line B-B in FIG. 1A. For easy understanding, the dimensions in FIG. 1C do not necessarily correspond to those in FIG. 1A.

As illustrated in FIG. 1A through FIG. 1C, a lower electrode 12 is located on a substrate 10 that is a silicon (Si) substrate. An air gap 30 having a dome-shaped bulge is formed between the flat principal surface of the substrate 10 and the lower electrode 12. The dome-shaped bulge is, for example, a bulge having a shape in which the height of the air gap 30 is low in the periphery of the air gap 30 and increases at closer distances to the center of the air gap 30. The lower electrode 12 includes, for example, a chrome (Cr) film and a ruthenium (Ru) film on the Cr film. Located on the lower electrode 12 is a piezoelectric film 14 mainly composed of aluminum nitride (AlN) having the (002) direction as a main axis. An upper electrode 16 is located on the piezoelectric film 14 so as to have a region (resonance region 50) in which the upper electrode 16 faces the lower electrode 12 across the piezoelectric film 14. The resonance region 50 has an elliptical shape, and is a region in which the acoustic wave in the thickness extension mode resonates. The resonance region 50 is provided so as to have a size equal to or smaller than that of the air gap 30 and overlap with the air gap 30 in plan view. The upper electrode 16 includes, for example, a Ru film and a Cr film located on the Ru film.

A protective film 20 is located so as to surround the lower electrode 12, the piezoelectric film 14, and the upper electrode 16. The protective film 20 entirely covers the upper surface, the side surface, and the lower surface of the piezoelectric film 14. The protective film 20 is, for example, a silicon nitride film, an aluminum oxide film, or a diamond-like carbon film, and has a better moisture resistance than the piezoelectric film 14.

As illustrated in FIG. 1A and FIG. 1C, penetration holes 35 for etching a sacrifice layer are formed in the piezoelectric film 14 and the lower electrode 12. The sacrifice layer is a layer for forming the air gap 30. The penetration holes 35 penetrate through the piezoelectric film 14 and communicate with the air gap 30. As illustrated in FIG. 1C, the protective film 20 is located on the side surfaces of the penetration holes 35.

When the piezoelectric thin film resonator has a resonant frequency of 2.0 GHz, the lower electrode 12 is configured to be formed of a Cr film with a film thickness of 10 nm and a Ru film with a film thickness of 200 nm. The piezoelectric film 14 is configured to be an AlN film with a film thickness of 1260 nm. The upper electrode 16 is configured to be formed of a Ru film with a film thickness of 230 nm and a Cr film with a film thickness of 50 nm. The protective film 20 is configured to be, for example, a silicon nitride film with a film thickness of 50 nm. The penetration hole 35 is configured to have a diameter of 10 µm.

The substrate 10 may be, instead of a Si substrate, a sapphire substrate, a spinel substrate, an alumina substrate, a quartz substrate, a glass substrate, a ceramic substrate, or a GaAs substrate. The lower electrode 12 and the upper electrode 16 may be formed of, instead of Ru and Cr, a single-layer film of aluminum (Al), titanium (Ti), copper (Cu), molybdenum (Mo), tungsten (W), tantalum (Ta), platinum (Pt), rhodium (Rh), or iridium (Ir), or a multilayered film of at least two of them. For example, the upper electrode 16 may be formed of a Ru film and a Mo film.

The piezoelectric film 14 may be made of, instead of aluminum nitride, zinc oxide (ZnO), lead zirconate titanate (PZT), or lead titanate ($PbTiO_3$). Alternatively, for example, the piezoelectric film 14 may be mainly composed of aluminum nitride, and contain other elements to improve the resonance characteristic or the piezoelectricity. For example, the use of scandium (Sc), a Group II element and a Group IV element, or a Group II element and a Group V element as additive elements improves the piezoelectricity of the piezoelectric film 14. Accordingly, the effective electromechanical coupling coefficient of the piezoelectric thin film resonator is improved. The Group II element is, for example, calcium (Ca), magnesium (Mg), strontium (Sr), or zinc (Zn). The Group IV element is, for example, Ti, zirconium (Zr), or hafnium (Hf). The Group V element is, for example, Ta, niobium (Nb), or vanadium (V). Alternatively, the piezoelectric film 14 may be mainly composed of aluminum nitride and contain boron (B).

Fabrication Method of the First Embodiment

Figure 2A:
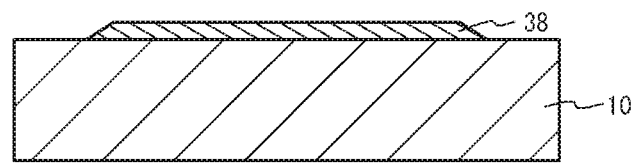
FIG. 2A through FIG. 2C are cross-sectional views illustrating a method of fabricating the piezoelectric thin film resonator in accordance with the first embodiment (No. 1)

FIG. 2A through FIG. 4C are cross-sectional views illustrating a method of fabricating the piezoelectric thin film resonator in accordance with the first embodiment. The cross-section corresponds to the cross-section taken along line B-B in FIG. 1A. As illustrated in FIG. 2A, a sacrifice layer 38 for forming an air gap is formed on the substrate 10 having a flat principal surface. The sacrifice layer 38 has a film thickness of, for example, 10 to 100 nm, and is made of a material selected from materials such as magnesium oxide (MgO), ZnO, germanium (Ge), and silicon oxide ($SiO_2$) that easily dissolve in an etching liquid or an etching gas. The sacrifice layer 38 is then patterned into a desired shape by photolithography and etching. The shape of the sacrifice layer 38 corresponds to the planar shape of the air gap 30, and includes, for example, a region to be the resonance region 50. The sacrifice layer 38 is formed by, for example, sputtering, vacuum evaporation, or chemical vapor deposition (CVD).

Figure 2B:
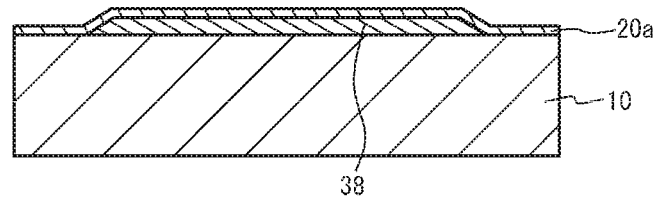

As illustrated in FIG. 2B, a protective film 20a is formed on the substrate 10 and the sacrifice layer 38. The protective film 20a is formed by, for example, CVD or sputtering.

Figure 2C:
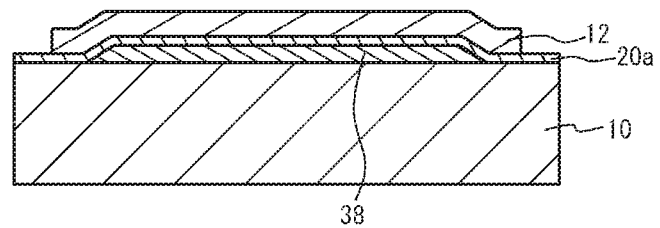

As illustrated in FIG. 2C, the lower electrode 12 is located on the protective film 20a. The lower electrode 12 is formed by, for example, sputtering, vacuum evaporation, or CVD. The lower electrode 12 is patterned by photolithography and etching. The lower electrode 12 may be formed by liftoff.

Figure 3A:
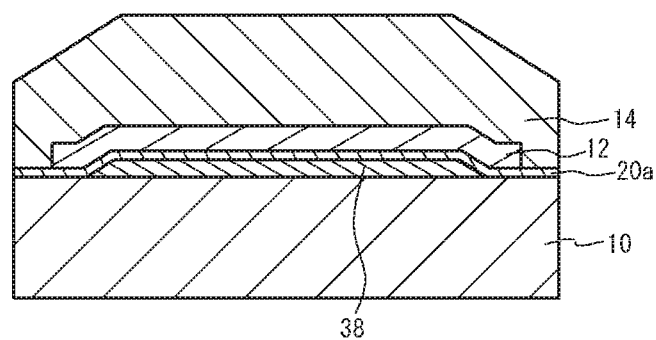
FIG. 3A through FIG. 3C are cross-sectional views illustrating the method of fabricating the piezoelectric thin film resonator in accordance with the first embodiment (No. 2)

As illustrated in FIG. 3A, the piezoelectric film 14 is formed on the lower electrode 12 and the protective film 20a by, for example, sputtering, vacuum evaporation, or CVD.

Figure 3B:
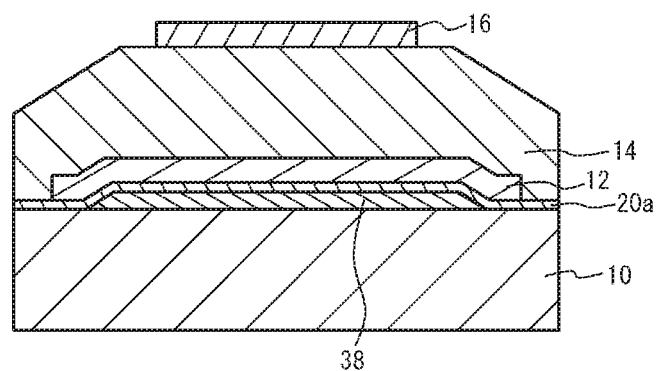

As illustrated in FIG. 3B, the upper electrode 16 is formed on the piezoelectric film 14 by sputtering, vacuum evaporation, or CVD. The upper electrode 16 is patterned into a desired shape by photolithography and etching. The upper electrode 16 may be formed by liftoff.

Figure 3C:
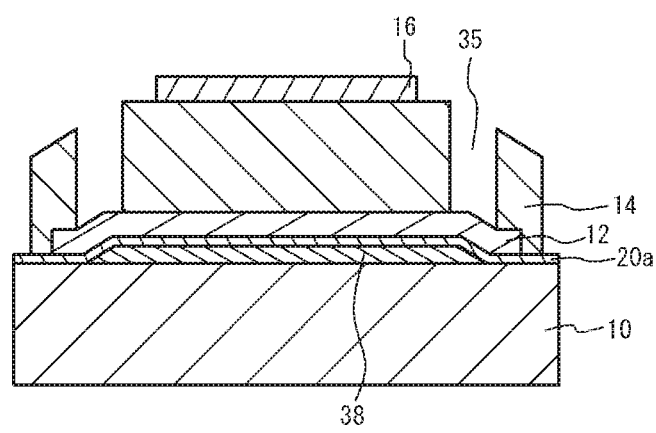

As illustrated in FIG. 3C, the piezoelectric film 14 is patterned into a desired shape by photolithography and etching. At this time, the penetration holes 35 are formed. The upper surface of the lower electrode 12 is exposed to the penetration holes 35.

Figure 4A:
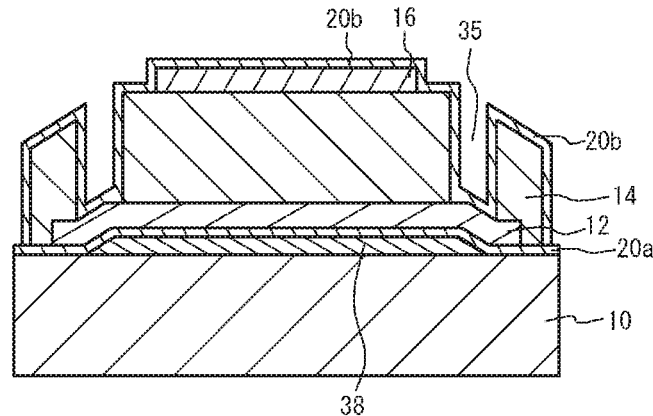
FIG. 4A through FIG. 4C are cross-sectional views illustrating the method of fabricating the piezoelectric thin film resonator in accordance with the first embodiment (No. 3)

As illustrated in FIG. 4A, a protective film 20b is formed on the piezoelectric film 14, the upper electrode 16, and the side surfaces of the penetration holes 35. The protective film 20b is formed by CVD or sputtering. The piezoelectric film 14 has a film thickness of approximately 1 µm, and the penetration hole 35 has a diameter of approximately 10 µm. Since the aspect ratio of the penetration hole 35 is small, the protective film 20b is able to be formed on the side surface of the penetration hole 35.

Figure 4B:
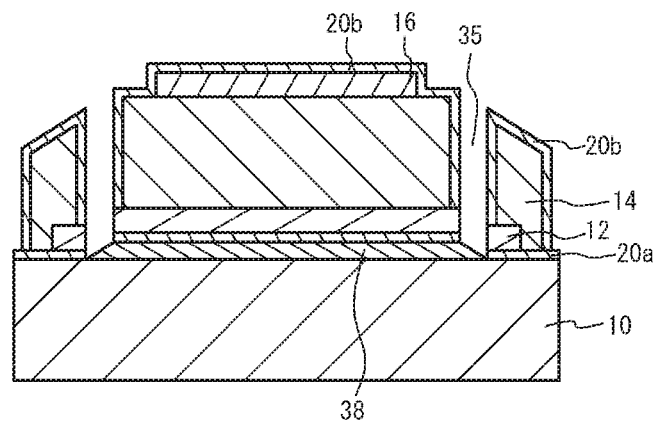

As illustrated in FIG. 4B, the protective film 20b, the lower electrode 12, and the protective film 20a under the penetration hole 35 are removed. When the protective films 20a and 20b are silicon nitride films and the lower electrode 12 is formed of a Cr film and a Ru film, these films are removed by, for example, dry etching, physical etching without chemical reaction, or ion beam milling. This process causes the penetration holes 35 to come in contact with the sacrifice layer 38.

Figure 4C:
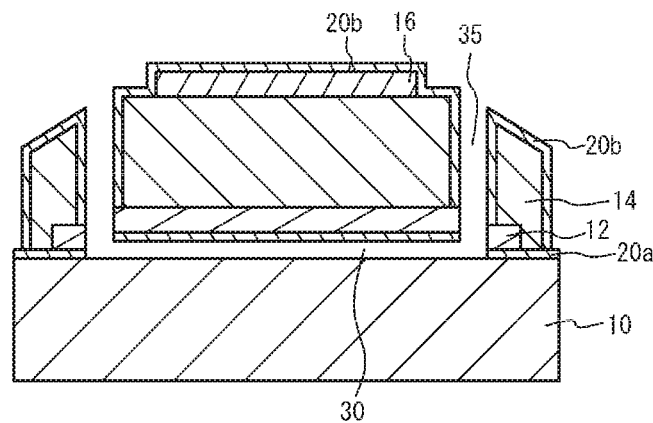

As illustrated in FIG. 4C, an etching liquid for etching the sacrifice layer 38 is introduced into the sacrifice layer 38 through the penetration holes 35. This process removes the sacrifice layer 38. A material for etching the sacrifice layer 38 is preferably a material that does not etch the materials constituting the resonator except the sacrifice layer 38. Especially, the material for etching is preferably a material that does not etch the lower electrode 12 with which the material for etching comes in contact. The stresses of the lower electrode 12, the piezoelectric film 14, and the upper electrode 16 are configured to be compression stresses. This configuration causes the lower electrode 12 through the upper electrode 16 to bulge out toward the side opposite from the substrate 10 so as to separate from the substrate 10 when the sacrifice layer 38 is removed. The air gap 30 having a dome-shaped bulge is formed between the lower electrode 12 and the substrate 10. The piezoelectric thin film resonator illustrated in FIG. 1A through FIG. 1C is fabricated through the above described processes.

Another Fabrication Method of the First Embodiment

Figure 5A:
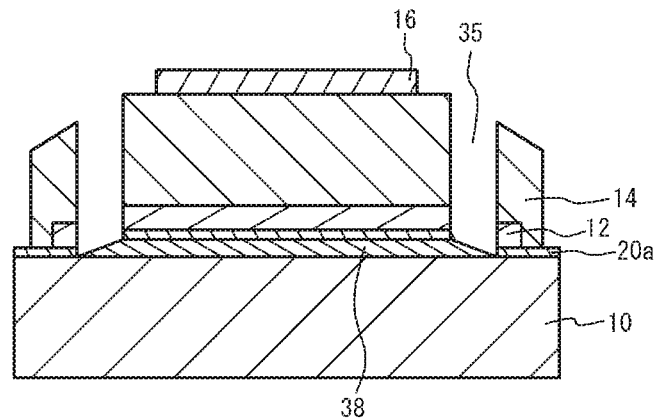
FIG. 5A through FIG. 5C are cross-sectional views illustrating another method of fabricating the piezoelectric thin film resonator of the first embodiment.
Figure 5B:
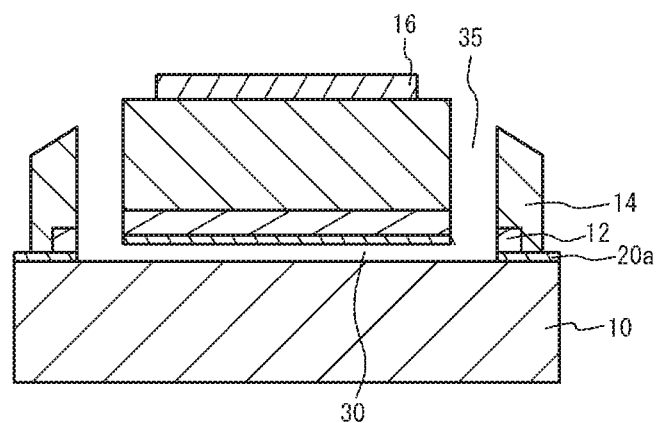
Figure 5C:
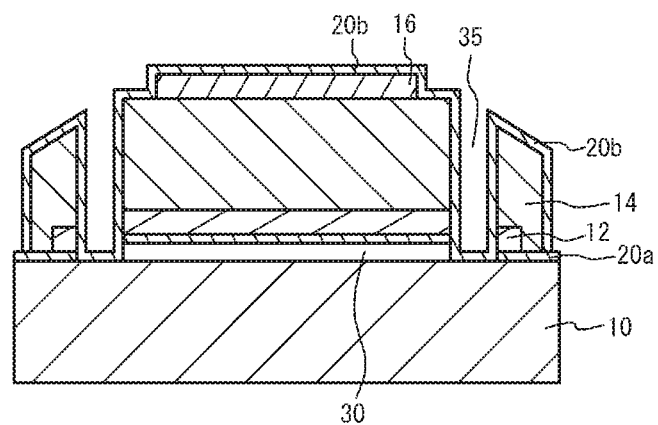

FIG. 5A through FIG. 5C are cross-sectional views illustrating another method of fabricating the piezoelectric thin film resonator of the first embodiment. As illustrated in FIG. 5A, after the process of FIG. 3B, the penetration holes 35 penetrating through the piezoelectric film 14, the lower electrode 12, and the protective film 20a are formed. The penetration holes 35 are in contact with the sacrifice layer 38.

As illustrated in FIG. 5B, an etching liquid is introduced through the penetration holes 35 to remove the sacrifice layer 38. This process forms the air gap 30.

As illustrated in FIG. 5C, the protective film 20b is formed on the piezoelectric film 14 and the upper electrode 16 and the side surface of the penetration hole 35. The protective film 20b is formed by CVD or sputtering. The piezoelectric thin film resonator illustrated in FIG. 1A through FIG. 1C is fabricated through the above processes.

Study on the Protective Film

The moisture resistance of the protective film 20 was evaluated. A $SiO_2$ film was formed on a silicon substrate by sputtering. The insulating film to be evaluated was left in an environment at a temperature of 85° C. and a humidity of 100% by using $D_2O$ (heavy water). The reason why $D_2O$ is used is to separate the water to be evaluated from the $H_2O$ (light water) initially remaining.

Figure 6:
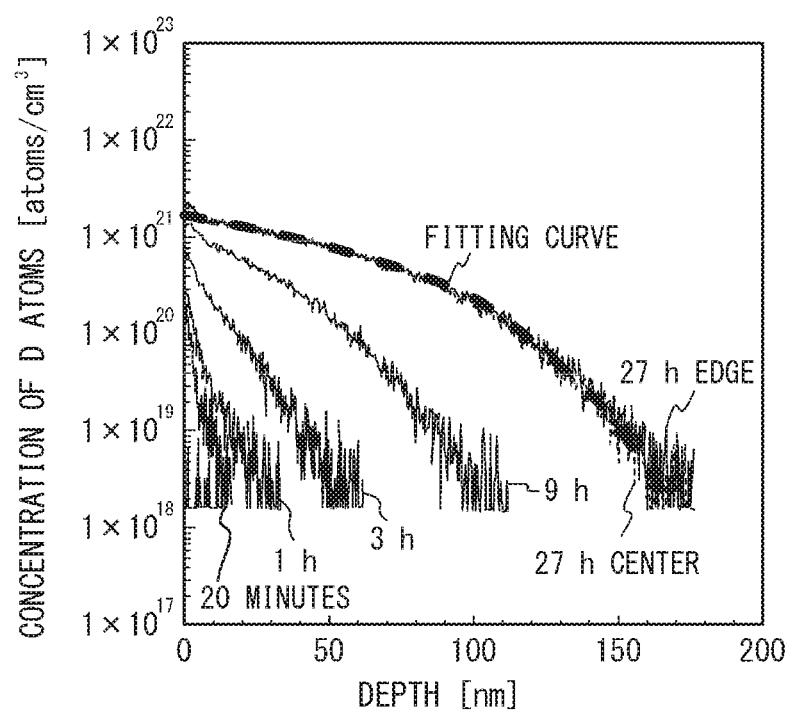
FIG. 6 is a graph of concentration of D atoms versus depth in a $SiO_2$ film.

Thereafter, the concentration of D atoms in the depth direction was evaluated by using dynamic mode secondary ion mass spectrometry (D-SIMS). FIG. 6 is a graph of concentration of D (heavy hydrogen) atoms versus depth from the surface of the $SiO_2$ film. Each time represents a time for which the $SiO_2$ film was left in an environment of 85° C. temperature and 100% humidity. The reference characters "27 h edge" and "27 h center" respectively correspond to a sample of a wafer edge and a sample of a wafer center that were left for 27 hours. As illustrated in FIG. 6, as the time for which the $SiO_2$ film was left in high temperature and high humidity environment increases, D atoms diffuse into the $SiO_2$ film more deeply. A bold dashed line is a fitting curve of the 27 h edge and the 27 h center by using Fick's laws. The diffusion coefficient obtained from this fitting curve is $2\times10^{-18}$ $m^2/s$. A smaller diffusion coefficient means less diffusion of water and better moisture resistance.

Figure 7A:
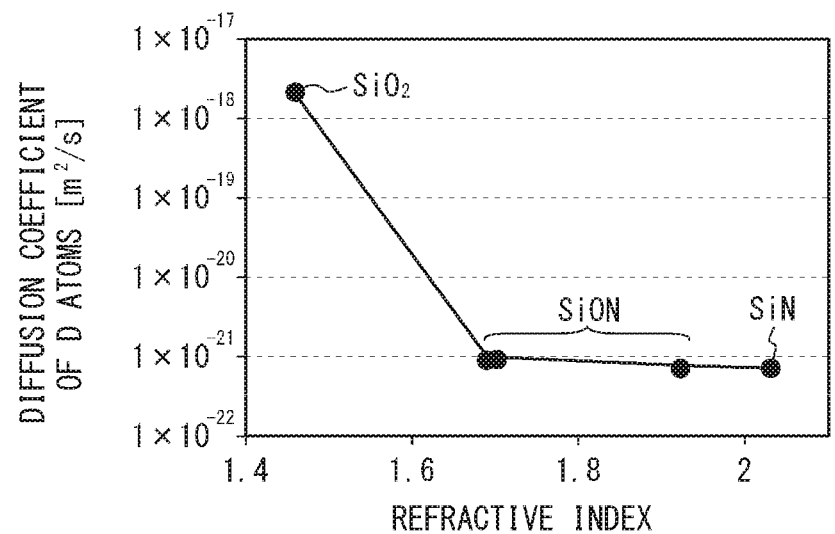
FIG. 7A and FIG. 7B are graphs of diffusion coefficient of D atoms versus refractive index in each film.
Figure 7B:
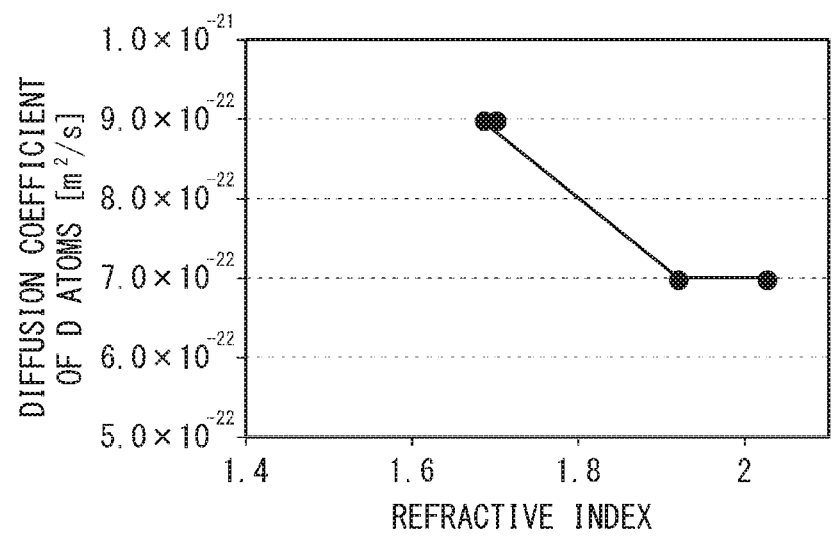

In the same manner, diffusion coefficients of D atoms of a silicon nitride ($SiN_x$) film and a silicon oxynitride (SiON) film were obtained. The insulating films were formed by sputtering. FIG. 7A and FIG. 7B are graphs of diffusion coefficient of D atoms versus refractive index in each film. FIG. 7B is an enlarged diagram of FIG. 7A. The refractive index is a refractive index of a light with a wavelength of 632.8 nm. The film having the greatest refractive index is a SiN film, and the film having the smallest refractive index is a $SiO_2$ film. The film between them is a SiON film. As the refractive index increases, the composition ratio of N to O increases.

As illustrated in FIG. 7A, the $SiO_2$ film has a large diffusion coefficient and no moisture resistance. The SiN film has the smallest diffusion coefficient and is superior in moisture resistance. The SiON film has a diffusion coefficient approximately equal to that of the SiN film and is superior in moisture resistance. Especially the SiON film having a refractive index of 1.7 or greater is considered to have a moisture resistance approximately equal to that of the SiN film. When the refractive index is 1.9 or greater, the diffusion coefficient is $7\times10^{-22}$ $m^2/s$. When the protective film 20 with a diffusion coefficient of $7\times10^{-22}$ $m^2/s$ is configured to have a film thickness of 20 nm, the moisture resistance of 1000 h or greater is secured.

The relation between the density and the diffusion coefficient of an aluminum oxide ($Al_2O_3$) film was examined. The aluminum oxide films were formed by atomic layer deposition (ALD), electron cyclotron resonance (ECR) sputtering, or radio frequency (RF) sputtering. Films formed by ALD were formed at different film formation temperatures.

Figure 8:
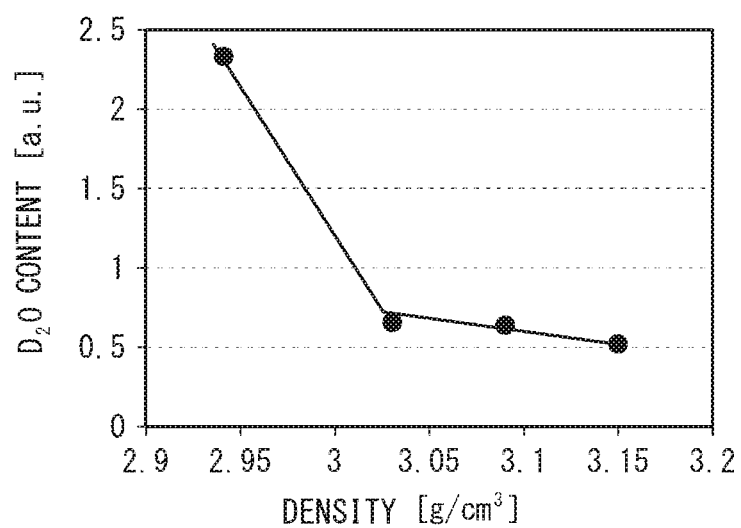
FIG. 8 is a graph of $D_2O$ content in each aluminum oxide film versus density.

FIG. 8 is a graph of $D_2O$ content in each aluminum oxide film versus density. As illustrated in FIG. 8, the aluminum oxide films with a density of 3 $g/cm^3$ or greater have a small $D_2O$ content, and are considered to have a good moisture resistance. The diffusion coefficient of the aluminum oxide film with a density of 3 $g/cm^3$ or greater was calculated and was $6\times10^{-23}$ $m^2/s$. When the protective film 20 with a diffusion coefficient of $6\times10^{-23}$ $m^2/s$ is configured to have a film thickness of 20 nm, the moisture resistance of 10000 h or greater is secured.

As described above, as a film having a good moisture resistance and to be used as the protective film 20, considered are a silicon nitride film, a silicon oxynitride film, and an aluminum oxide film. Alternatively, a dense film such as a diamond-like carbon (DLC) film may be used. The DLC film is formed by, for example, CVD using $C_2H_2$ and tetramethylsilane (TMS) as a film formation gas. These films are able to secure a moisture resistance with a very thin film thickness of 50 nm or less. Accordingly, the effect on the characteristics of the piezoelectric thin film resonator is small.

In the first embodiment, the penetration holes 35 penetrating through the piezoelectric film 14 are provided. The protective film 20 covers the upper surface of the piezoelectric film 14, the side surface of the piezoelectric film 14, and the inner surfaces of the penetration holes 35. This structure inhibits water from penetrating into the piezoelectric film 14 from the inner surface of the penetration hole 35. Thus, the moisture resistance of the piezoelectric thin film resonator is enhanced.

The air gap 30 is located between the substrate 10 and the lower electrode 12 so as to overlap with the resonance region 50. The penetration hole 35 is a hole for removing the sacrifice layer 38 when the air gap 30 is formed, and is directly connected to the air gap 30 as illustrated in FIG. 4C. Alternatively, the penetration hole 35 is connected to the air gap 30 only through the protective film 20 as illustrated in FIG. 5C. That is, the lower electrode 12 is not located between the air gap 30 and the penetration hole 35. As described above, by forming the protective film 20 on the inner surface of the penetration hole 35 for forming the air gap 30, the penetration of water from the penetration hole 35 into the piezoelectric film 14 is reduced.

The protective film 20 covers the lower surface of the piezoelectric film 14. This structure further enhances the moisture resistance.

When the piezoelectric film 14 is an aluminum nitride film, the deliquesce is large. Thus, used as the protective film 20 is at least one of a silicon nitride film, an aluminum oxide film, and a diamond-like carbon film. This structure enables to secure the moisture resistance with a thin film, and thus reduces the effect on the characteristics.

First Variation of the First Embodiment

Figure 9A:
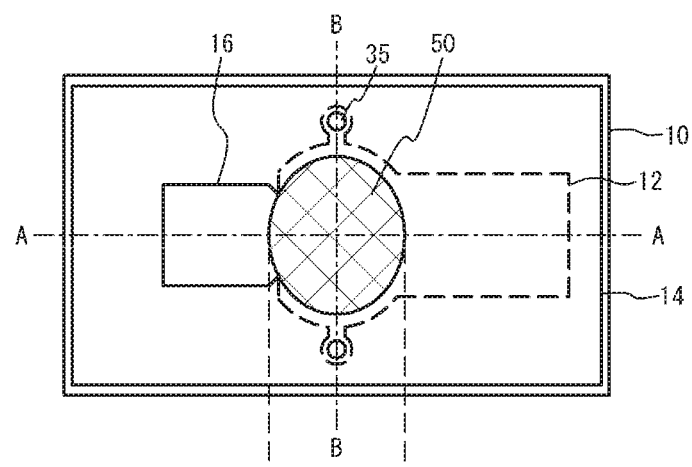
FIG. 9A is a plan view of a piezoelectric thin film resonator in accordance with a first variation of the first embodiment.
Figure 9B:
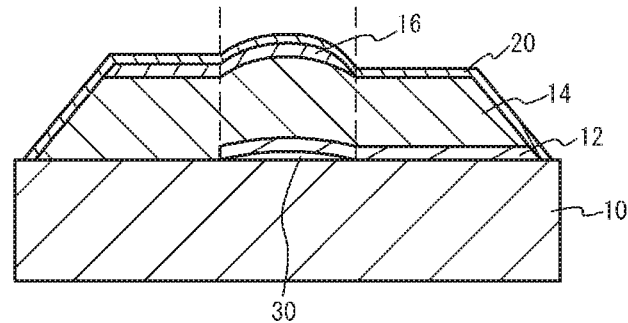
FIG. 9B is a cross-sectional view taken along line A-A in FIG. 9A.
Figure 9C:
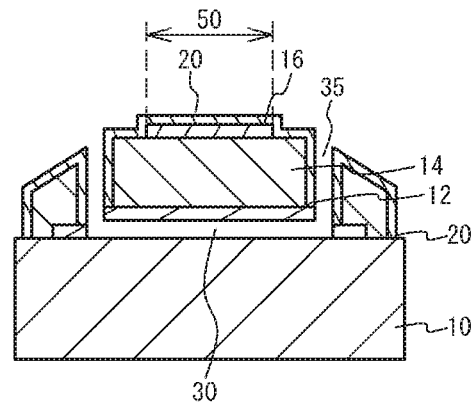
FIG. 9C is a cross-sectional view taken along line B-B in FIG. 9A.

FIG. 9A is a plan view of a piezoelectric thin film resonator in accordance with a first variation of the first embodiment, FIG. 9B is a cross-sectional view taken along line A-A in FIG. 9A, and FIG. 9C is a cross-sectional view taken along line B-B in FIG. 9A. As illustrated in FIG. 9A through FIG. 9C, no protective film 20 is provided between the piezoelectric film 14 and the substrate 10. Other structures are the same as those of the first embodiment, and the description thereof is thus omitted.

When the lower surface of the piezoelectric film 14 is covered by the substrate 10 and the lower electrode 12, the lower surface of the piezoelectric film 14 is never in direct contact with the air. Thus, the protective film 20 may not be necessarily provided between the piezoelectric film 14 and the substrate 10. It may be considered that water penetrates through the lower electrode 12 and/or the boundary face between the substrate 10 and the piezoelectric film 14. Thus, as in the first embodiment, the protective film 20 is preferably located on the lower surface of the piezoelectric film 14.

Second Embodiment

Figure 10A:
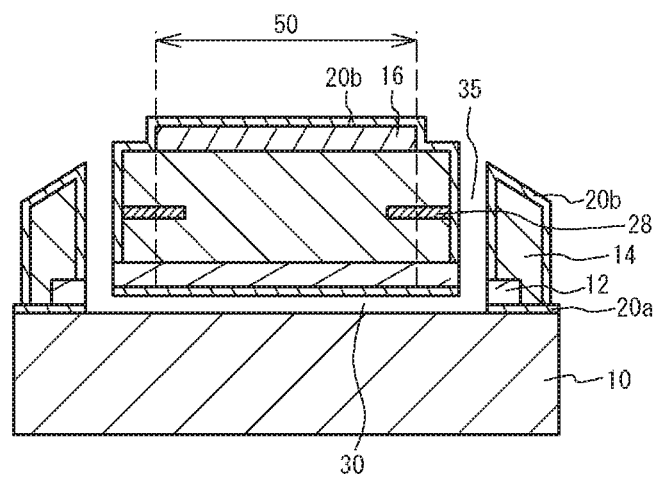
FIG. 10A and FIG. 10B are cross-sectional views of a second embodiment and a first variation of the second embodiment, respectively.
Figure 10B:
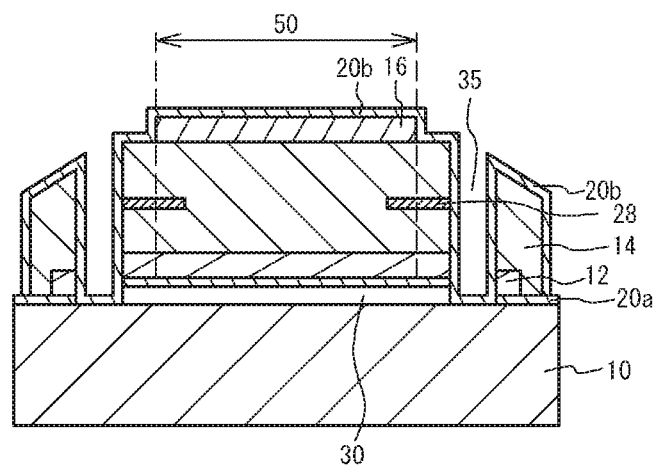

FIG. 10A and FIG. 10B are cross-sectional views of a second embodiment and a first variation of the second embodiment. As illustrated in FIG. 10A and FIG. 10B, an insertion film 28 is inserted in the piezoelectric film 14. The insertion film 28 is provided in the outer peripheral region of the resonance region, and is not provided in the center region. The acoustic impedance of the insertion film 28 is less than the acoustic impedance of the piezoelectric film 14. Accordingly, the acoustic wave is inhibited from leaking from the inside of the resonance region 50 in the lateral direction. Thus, the Q-value is improved. The insertion film 28 may be interposed between the lower electrode 12 and the piezoelectric film 14 or between the piezoelectric film 14 and the upper electrode 16. Other structures are the same as those of the first embodiment illustrated in FIG. 4C and FIG. 5C, and the description thereof is thus omitted.

Third Embodiment

Figure 11A:
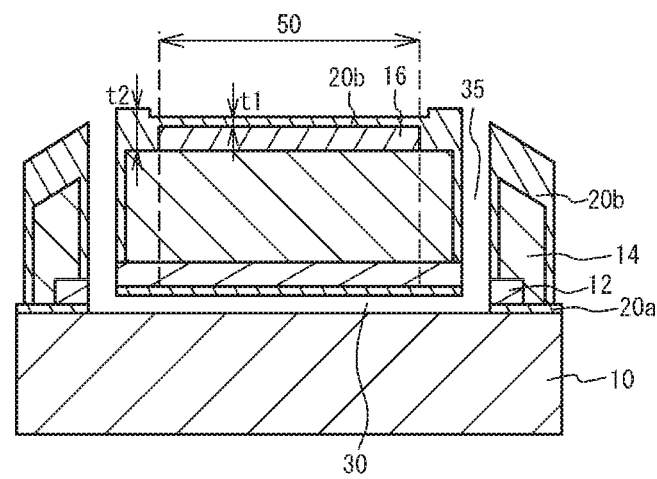
FIG. 11A and FIG. 11B are cross-sectional views of a third embodiment and a first variation of the third embodiment, respectively.
Figure 11B:
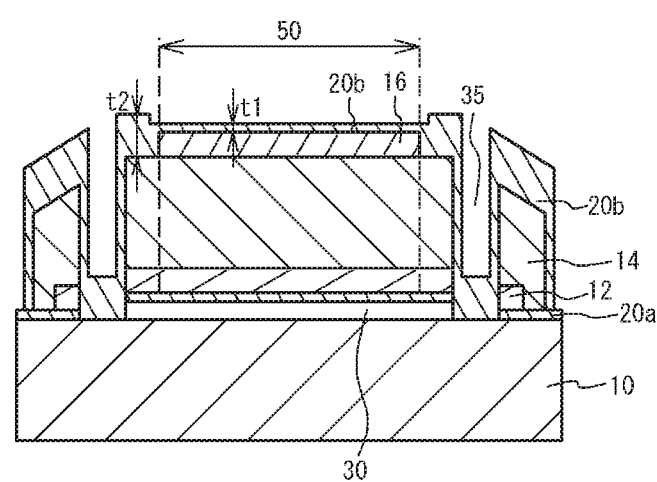

FIG. 11A and FIG. 11B are cross-sectional views of a third embodiment and a first variation of the third embodiment, respectively. As illustrated in FIG. 11A and FIG. 11B, the film thickness t1 of the protective film 20b located in the resonance region 50 is less than the film thickness t2 of the protective film 20b located in the region other than the resonance region 50. The film thickness of the protective film 20 is determined taking into consideration the moisture resistance. For example, t2=50 nm. In the resonance region 50, the upper electrode 16 is located on the piezoelectric film 14. Thus, even when the film thickness t1 of the protective film 20b in the resonance region 50 is less than the film thickness t2, the moisture resistance is secured. The resonant frequency is adjusted with use of the film thickness of the protective film 20b. Thus, the protective film 20b in the resonance region 50 is thinly etched to adjust the resonant frequency. The etching is conducted by dry etching or wet etching. At this time, since the protective film 20b in the region other than the resonance region 50 is not etched, the moisture resistance in the region other than the resonance region 50 is not affected. Other structures are the same as those of the first embodiment illustrated in FIG. 4C and FIG. 5C, and the description thereof is thus omitted.

In the third embodiment and the variation thereof, the protective film 20b located on the upper electrode 16 within the resonance region 50 is thinner than the protective film 20b covering the region other than the resonance region 50 of the upper surface of the piezoelectric film 14. This structure enables to secure the film thickness of the protective film 20 for securing the moisture resistance in the region other than the resonance region 50 and adjust the frequency with use of the film thickness of the protective film 20b in the resonance region 50.

Fourth Embodiment

Figure 12A:
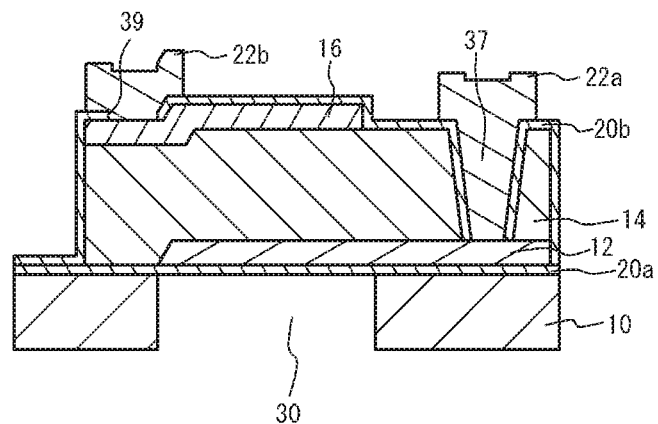
FIG. 12A and FIG. 12B are cross-sectional views of a fourth embodiment and a first variation of the fourth embodiment.
Figure 12B:
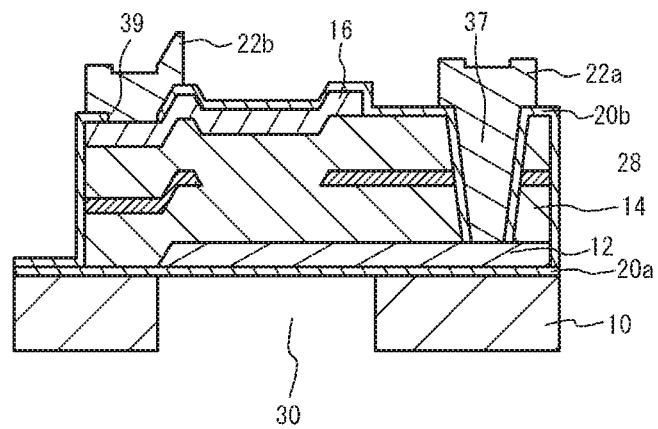

FIG. 12A and FIG. 12B are cross-sectional views of a fourth embodiment and a first variation of the fourth embodiment. As illustrated in FIG. 12A, a penetration hole 37 penetrating to the lower electrode 12 is formed in the piezoelectric film 14. The protective film 20b is located on the inner surface of the penetration hole 37. A pad 22a is located inside the penetration hole 37 and on the protective film 20b. The pad 22a is electrically connected to the lower electrode 12 through the penetration hole 37. An aperture 39 is formed in the protective film 20b on the upper electrode 16. A pad 22b is located inside the aperture 39 and on the protective film 20b. The pad 22b is electrically connected to the upper electrode 16 through the aperture 39. The pads 22a and 22b are formed of, for example, a Ti film with a film thickness of 100 nm and a Au film with a film thickness of 500 nm. The air gap 30 is formed so as to penetrate through the substrate 10. Other structures are the same as those of the first embodiment, and the description thereof is thus omitted.

As illustrated in FIG. 12B, in the first variation of the fourth embodiment, as in the second embodiment and the first variation thereof, the insertion film 28 is inserted in the piezoelectric film 14 in the outer peripheral region of the resonance region. Other structures are the same as those of the fourth embodiment, and the description thereof is thus omitted.

In the fourth embodiment and the first variation of the fourth embodiment, the pad 22a is a pad for electrically connecting the lower electrode 12 to an external circuit, and, for example, a bump is formed thereon. Thus, the penetration hole 37 is provided in the protective film 20b and the piezoelectric film 14 on the lower electrode 12. The pad 22a is located inside the penetration hole 37 and connects to the lower electrode 12. Water easily penetrates into the boundary face between the pad 22a and the protective film 20b or the piezoelectric film 14. Thus, the protective film 20b is provided on the side surface of the piezoelectric film 14 exposed to the penetration hole 37. This structure reduces the penetration of water into the piezoelectric film 14. Furthermore, the pad 22a covers the protective film 20b covering the inner surface of the penetration hole 35 in the piezoelectric film 14. This structure further reduces the penetration of water into the piezoelectric film 14.

The pad 22b is a pad for electrically connecting the upper electrode 16 to an external circuit, and, for example, a bump is formed thereon. Thus, the aperture 39 is located in the protective film 20b on the upper electrode 16. The aperture 39 causes water to easily penetrate into the piezoelectric film 14. Thus, the pad 22b is provided so as to cover the inner surface of the aperture 39 of the protective film 20b and the upper electrode 16 exposed from the aperture 39. This structure reduces the penetration of water into the piezoelectric film 14.

Fifth Embodiment

Figure 13A:
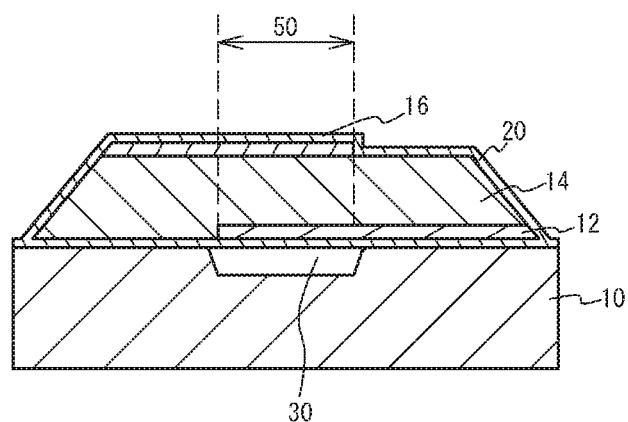
FIG. 13A and FIG. 13B are cross-sectional views of piezoelectric thin film resonators of a fifth embodiment and a first variation of the fifth embodiment.
Figure 13B:
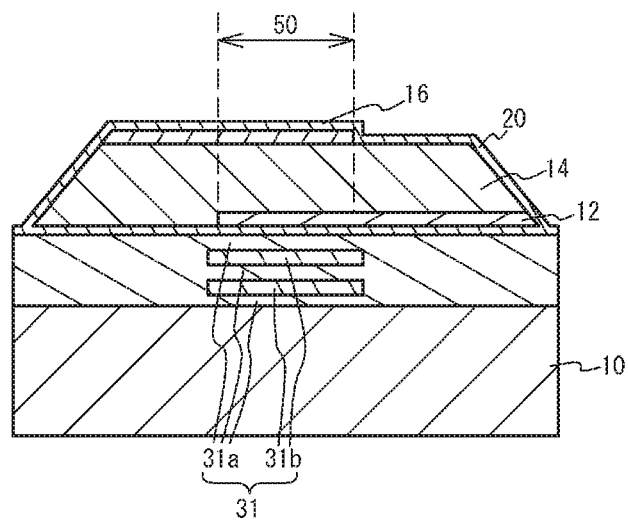

A fifth embodiment changes the structure of the air gap 30. FIG. 13A and FIG. 13B are cross-sectional views of piezoelectric thin film resonators of a fifth embodiment and a first variation of the fifth embodiment, respectively. As illustrated in FIG. 13A, a recess is formed on the upper surface of the substrate 10. The lower electrode 12 is flatly formed on the substrate 10. Thus, the air gap 30 is formed in the recess of the substrate 10. The air gap 30 is formed so as to include the resonance region 50. Other structures are the same as those of the first embodiment, and the description thereof is thus omitted. An insulating film may be formed so as to be in contact with the lower surface of the lower electrode 12. That is, the air gap 30 may be formed between the substrate 10 and the insulating film being in contact with the lower electrode 12. The insulating film may be, for example, an aluminum nitride film.

As illustrated in FIG. 13B, an acoustic mirror 31 is formed under the lower electrode 12 in the resonance region 50. The acoustic mirror 31 is formed of a film 31a with low acoustic impedance and a film 31b with high acoustic impedance alternately stacked. Each of the films 31a and 31b has a film thickness of, for example, λ/4 (λ is the wavelength of the acoustic wave). The numbers of the films 31a and the films 31b stacked are freely selected. For example, the acoustic mirror 31 may have a structure in which a single film with acoustic impedance different from that of the substrate 10 is located in the substrate 10. Other structures are the same as those of the first embodiment, and the description thereof is thus omitted.

In the first through fourth embodiments and the variations thereof, the air gap 30 may be formed in the same manner as that of the fifth embodiment, or the acoustic mirror 31 may be formed instead of the air gap 30 as in the first variation of the fifth embodiment.

As in the first through fifth embodiments, the piezoelectric thin film resonator may be a film bulk acoustic resonator (FBAR) in which the air gap 30 is formed between the substrate 10 and the lower electrode 12 in the resonance region 50. Alternatively, as in the first variation of the fifth embodiment, the piezoelectric thin film resonator may be a solidly mounted resonator (SMR) including the acoustic mirror 31 that reflects an acoustic wave propagating through the piezoelectric film 14 under the lower electrode 12 in the resonance region 50.

In the first through fifth embodiments and the variations thereof, the resonance region 50 has an elliptical shape, but may have other shape. For example, the resonance region 50 may have a polygonal shape such as a quadrangle shape or a pentagonal shape.

Sixth Embodiment

Figure 14A:
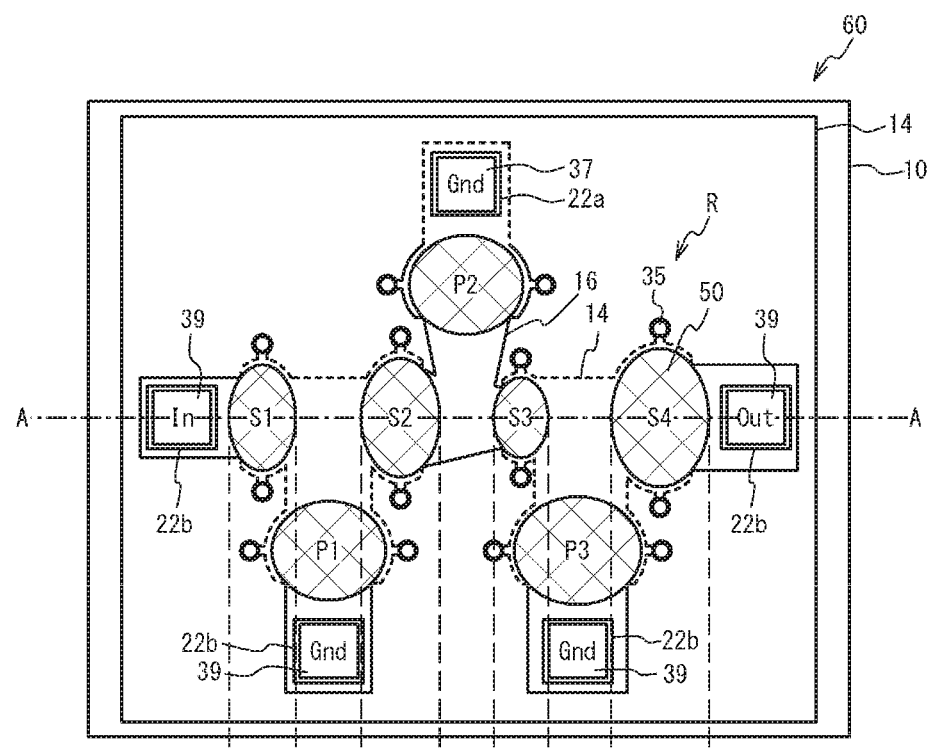
FIG. 14A is a plan view of a filter in accordance with a sixth embodiment.
Figure 14B:
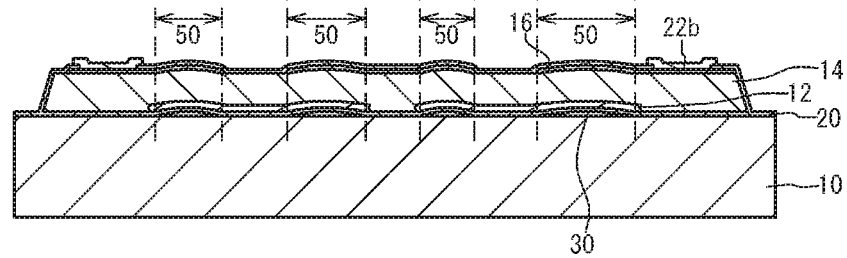
FIG. 14B is a cross-sectional view taken along line A-A in FIG. 14A.

FIG. 14A is a plan view of a filter in accordance with a sixth embodiment, and FIG. 14B is a cross-sectional view taken along line A-A in FIG. 14A. As illustrated in FIG. 14A and FIG. 14B, in a filter 60, a plurality of piezoelectric thin film resonators R and the pads 22a and 22b are located on the same substrate 10. The pads 22a and 22b function as an input pad In, an output pad Out, and ground pads Gnd. The piezoelectric thin film resonators R include series resonators S1 through S4 and parallel resonators P1 through P3. One or more series resonators S1 through S4 are connected in series between the input pad In and the output pad Out, and one or more parallel resonators P1 through P3 are connected in parallel between the input pad In and the output pad Out. First ends of the parallel resonators P1 through P3 are coupled to the ground pads Gnd.

The piezoelectric thin film resonators R are interconnected by the lower electrode 12 or the upper electrode 16. The pad 22b is coupled to the upper electrode 16 through the aperture 39 formed in the protective film 20 as in the fourth embodiment. The pad 22a is coupled to the lower electrode 12 through the penetration hole 37 penetrating through the protective film 20 and the piezoelectric film 14 as in the fourth embodiment. The penetration hole 35 is coupled to the air gap 30 as in the first embodiment. The piezoelectric thin film resonators R share one piezoelectric film 14. The upper surface, the side surface, and the lower surface of the piezoelectric film 14 and the inner surfaces of the penetration holes 35 and 37 are covered with the protective film 20. The protective film 20 covering the piezoelectric film 14 reduces the penetration of water into the piezoelectric film 14, and thereby reduces the deterioration of the piezoelectric film 14.

As in the sixth embodiment, the application of the first through fifth embodiments and the variations thereof to the filter improves the moisture resistance of the filter 60. The ladder-type filter is described as an example of the filter, but the filter may be a longitudinally coupled filter. Additionally, the number of series resonators and parallel resonators in the ladder-type filter is freely selected.

Seventh Embodiment

Figure 15:
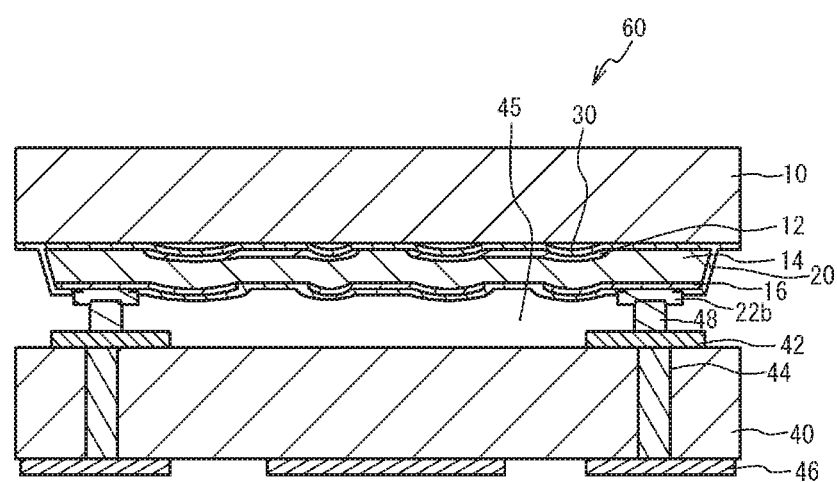
FIG. 15 is a cross-sectional view of a module in accordance with a seventh embodiment.

A seventh embodiment mounts the filter of the sixth embodiment on a substrate. FIG. 15 is a cross-sectional view of a module in accordance with the seventh embodiment. As illustrated in FIG. 15, the filter 60 of the sixth embodiment is flip-chip mounted on the substrate 40. Terminals 42 and 46 are located on the upper surface and the lower surface of the substrate 40, respectively. Internal wiring lines 44 penetrating through the substrate 40 are provided. The internal wiring line 44 electrically connects the terminals 42 and 46. The terminal 42 is bonded with the pad 22b by a bump 48. The substrate 40 is, for example, a ceramic multilayered substrate made of high temperature co-fired ceramic (HTCC) or low temperature co-fired ceramic (LTCC), a printed board, a sapphire substrate, a glass substrate, a HICERAM (registered trademark) substrate, or a resin substrate. The terminals 42 and 46 and the internal wiring lines 44 are formed of a metal layer such as a copper layer or a gold layer. The bump 48 is a metal bump such as a gold bump, a copper bump, or a solder bump.

Since the filter 60 has a high moisture resistance, it is only necessary to mount a chip including the filter 60 formed therein on the substrate 40. The protective film 20 is exposed to an air gap 45 (for example, air or atmosphere). As clear from above, a hermetic sealing structure may not be necessarily provided. Therefore, the module is reduced in size and/or price.

Eighth Embodiment

Figure 16:
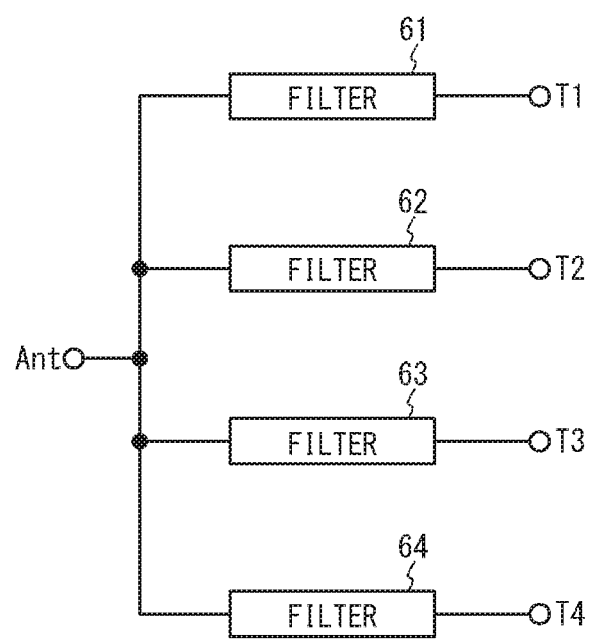
FIG. 16 is a circuit diagram of a quadplexer in accordance with an eighth embodiment.

An eighth embodiment uses the filter of the sixth embodiment in a multiplexer. FIG. 16 is a circuit diagram of a quadplexer in accordance with the eighth embodiment. As illustrated in FIG. 16, filters 61 through 64 are respectively connected between a common terminal Ant and terminals T1 through T4. Two of the filters 61 through 64 are transmit filters, and the remaining two are receive filters. All the filters 61 through 64 may be transmit filters, or may be receive filters. The transmit filters output signals in the transmit band to the common terminal Ant among high-frequency signals input to the terminals T1 through T4, and suppress signals with other frequencies. The receive filters outputs signals in the receive band to the terminals T1 through T4 among high-frequency signals input to the common terminal Ant, and suppress signals with other frequencies.

Figure 17A:
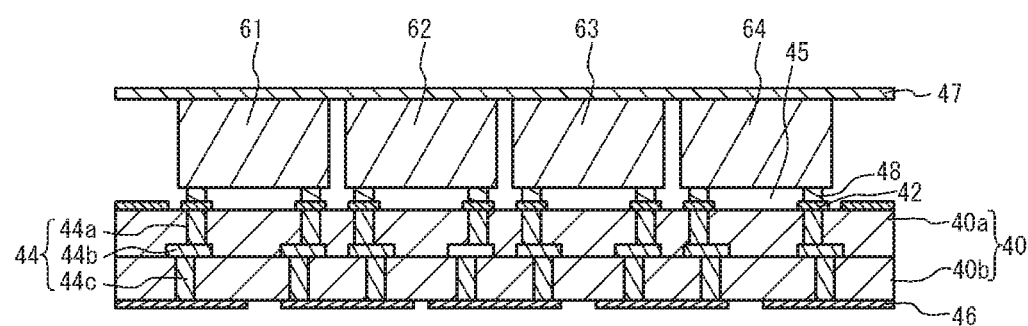
FIG. 17A and FIG. 17B are cross-sectional views of a quadplexer in accordance with the eighth embodiment.
Figure 17B:
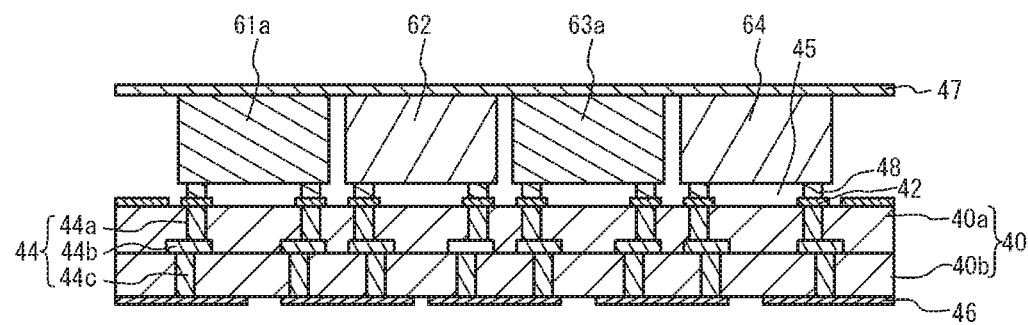

FIG. 17A and FIG. 17B are cross-sectional views of a quadplexer in accordance with the eighth embodiment. As illustrated in FIG. 17A, the filters 61 through 64 are mounted on a substrate 40. The substrate 40 is a multilayered substrate, and includes insulating layers 40a and 40b that are stacked. Wiring lines 44b are located between the insulating layers 40a and 40b. Via wirings 44a and 44c penetrating through the insulating layers 40a and 40b are provided. The via wirings 44a and 44c and the wiring lines 44b constitute internal wiring lines 44. The internal wiring line 44 electrically connects the terminals 42 and 46. The filters 61 through 64 are the filters in accordance with the sixth embodiment, and are bonded to the terminal 42 through the bump 48 in a chip state as in the seventh embodiment. A lid 47 is located on the upper surfaces of the filters 61 through 64. The chip including the filters 61 through 64 formed therein is exposed to the air gap 45.

As illustrated in FIG. 17B, filters 61a and 63a are filters using surface acoustic wave resonators. Other structures are the same as those of FIG. 17A, and the description thereof is thus omitted.

As described in the eighth embodiment, by mounting the filters of the sixth embodiment on the substrate 40 in a chip state, the multiplexer is reduced in size and/or in price.

The quadplexer is described as an example of the multiplexer, but the multiplexer may be a duplexer or a triplexer. It is sufficient if at least one of filters includes the piezoelectric thin film resonator according to any one of the first through fifth embodiments and the variations thereof.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
a substrate;
a piezoelectric film located on the substrate and mainly composed of aluminum nitride;
a lower electrode and an upper electrode facing each other across at least a part of the piezoelectric film; and
a protective film covering an upper surface of the piezoelectric film, a side surface of the piezoelectric film, and an inner surface of a penetration hole penetrating through the piezoelectric film and the lower electrode, the protective film entirely covering an upper surface of the upper electrode in a resonance region, where the upper electrode faces the lower electrode across the piezoelectric film, and the inner surface of the piezoelectric film in the penetration hole, an inner surface of the lower electrode in the penetration hole being exposed from the protective film to an air in the penetrating hole, the protective film being a SiON film with a refractive index of a light with a wavelength of 632.8 nm of 1.7 or greater, an aluminum oxide film with a density of 3 g/cm$^3$ or greater or a diamond-like carbon film, wherein:
an air gap is located between the substrate and the lower electrode and overlaps with a resonance region and a region outside the resonance region in a plan view, and
the penetration hole overlaps with the air gap in the plan view and is directly connected to the air gap.

2. A piezoelectric thin film resonator comprising:
a substrate;
a piezoelectric film located on the substrate and mainly composed of aluminum nitride;
a lower electrode and an upper electrode facing each other across at least a part of the piezoelectric film; and
a protective film covering an upper surface of the piezoelectric film, a side surface of the piezoelectric film, and an inner surface of a penetration hole penetrating through the piezoelectric film and the lower electrode, the protective film entirely covering an upper surface of the upper electrode in a resonance region, where the upper electrode faces the lower electrode across the piezoelectric film, and the inner surface of the piezoelectric film and the lower electrode in the penetration hole, the protective film being a SiON film with a refractive index of a light with a wavelength of 632.8 nm of 1.7 or greater, an aluminum oxide film with a density of 3 g/cm$^3$ or greater or a diamond-like carbon film, wherein:
an air gap is located between the substrate and the lower electrode and overlap with the resonance region and a region outside the resonance region in a plan view, and
the protective film extends from the penetration hole to an upper surface of the substrate in the air gap and are located between the penetration hole and the air gap.

3. A piezoelectric thin film resonator comprising:
a substrate;
a piezoelectric film located on the substrate and mainly composed of aluminum nitride;
a lower electrode and an upper electrode facing each other across at least a part of the piezoelectric film; and
a protective film covering an upper surface of the piezoelectric film, a side surface of the piezoelectric film, and an inner surface of a penetration hole penetrating through the piezoelectric film and not penetrating through the lower electrode, the protective film entirely covering an upper surface of the upper electrode in a resonance region, where the upper electrode faces the lower electrode across the piezoelectric film, and the inner surface of the piezoelectric film in the penetration hole, the protective film being a SiON film with a refractive index of a light with a wavelength of 632.8 nm of 1.7 or greater, an aluminum oxide film with a density of 3 g/cm$^3$ or greater or a diamond-like carbon film,
a pad located inside the penetration hole, directly connected to an upper surface of the lower electrode and covers the inner surface of the protective film in the penetration hole.

4. The piezoelectric thin film resonator according to claim 1, wherein
the protective film covers a lower surface of the piezoelectric film.

5. The piezoelectric thin film resonator according to claim 1, wherein
an aperture is located in the protective film on the upper electrode, and a pad is located so as to cover an inner surface of the aperture and the upper electrode exposed from the aperture.

6. The piezoelectric thin film resonator according to claim 1, wherein
a portion of protective film located on the upper electrode within the resonance region is thinner than another portion of the protective film located on the upper surface of the piezoelectric film in a region other than the resonance region.

7. A filter comprising the piezoelectric thin film resonator as set forth in claim 1.

8. A multiplexer comprising the filter as set forth in claim 7.

9. The piezoelectric thin film resonator according to claim 1, wherein
the protective film is the SiON film with a refractive index of a light with a wavelength of 632.8 nm of 1.7 or greater.

10. The piezoelectric thin film resonator according to claim 1, wherein
the protective film is the aluminum oxide film with a density of 3 g/cm$^3$ or greater.

11. The piezoelectric thin film resonator according to claim 1, wherein
the protective film is the diamond-like carbon film.

12. The piezoelectric thin film resonator according to claim 1, wherein
the piezoelectric film is not in direct contact with the air.

13. The piezoelectric thin film resonator according to claim 2, wherein
the protective film covers a lower surface of the piezoelectric film.

14. The piezoelectric thin film resonator according to claim 3, wherein
the protective film covers a lower surface of the piezoelectric film.

15. A filter comprising the piezoelectric thin film resonator according to claim 2.

16. A multiplexer comprising the filter according to claim 15.

17. A filter comprising the piezoelectric thin film resonator according to claim 3.

18. A multiplexer comprising the filter according to claim 17.

* * * * *